United States Patent [19]
Fan et al.

[11] Patent Number: 5,474,719
[45] Date of Patent: Dec. 12, 1995

[54] METHOD FOR FORMING SOLID OBJECTS UTILIZING VISCOSITY REDUCIBLE COMPOSITIONS

[75] Inventors: Roxy N. Fan, E. Brunswick, N.J.;
Mario Grossa, Geissberg, Germany;
John A. Lawton, Landenberg, Pa.

[73] Assignee: E. I. Du Pont de Nemours and Company, Wilmington, Del.

[21] Appl. No.: 655,681

[22] Filed: Feb. 14, 1991

[51] Int. Cl.$^6$ .......................... B29C 35/08; B29C 41/02
[52] U.S. Cl. .................. 264/401; 156/273.3; 156/275.5; 156/307.1; 264/37; 264/308; 427/510; 427/512; 427/553
[58] Field of Search .............. 264/22, 37, 308; 425/174.4, 217, 375; 156/273.3, 275.5, 307.1, 379.6, 538; 427/43.1, 44, 53.1, 54.1, 345, 356, 358, 510, 512, 553; 118/100, 120, 423, 428, 429, 500, 620; 250/432 R, 492.1; 365/106, 107, 119, 120, 126, 127; 430/270, 327; 522/910

[56] References Cited

U.S. PATENT DOCUMENTS

| | | | |
|---|---|---|---|
| 2,775,758 | 12/1956 | Munz | 342/179 |
| 3,264,103 | 8/1966 | Cohen et al. | 430/254 |
| 3,395,014 | 7/1968 | Cohen et al. | 430/254 |
| 4,844,144 | 7/1989 | Murphy et al. | 164/35 |
| 4,863,538 | 9/1989 | Deckard | 156/62.2 |
| 4,929,402 | 5/1990 | Hull | 264/22 |
| 4,942,001 | 7/1990 | Murphy et al. | 264/22 |
| 4,942,006 | 7/1990 | Fan et al. | 427/54.1 |
| 4,943,928 | 7/1990 | Campbell et al. | 364/477 |
| 4,945,032 | 7/1990 | Murphy et al. | 430/394 |
| 4,961,154 | 10/1990 | Pomerantz et al. | 364/522 |
| 5,002,854 | 3/1991 | Fan et al. | 430/270 |
| 5,002,855 | 3/1991 | Fan et al. | 430/270 |
| 5,031,120 | 7/1991 | Pomerantz et al. | 395/119 |
| 5,141,680 | 8/1992 | Almquist et al. | 264/22 |

FOREIGN PATENT DOCUMENTS

| | | |
|---|---|---|
| 354637 | 2/1990 | European Pat. Off. . |
| 355944 | 2/1990 | European Pat. Off. . |
| 361847 | 4/1990 | European Pat. Off. . |
| 376571 | 4/1990 | European Pat. Off. . |
| 2583333 | 12/1986 | France ............ 264/22 |
| 61-114818 | 6/1986 | Japan . |
| 61-114817 | 6/1986 | Japan . |
| 61-217219 | 9/1986 | Japan ............ 264/22 |
| 1-204915 | 8/1989 | Japan . |
| 63-165222 | 1/1990 | Japan . |
| WO8910255 | 11/1989 | WIPO . |
| WO8910254 | 11/1989 | WIPO . |
| WO8910249 | 11/1989 | WIPO . |

OTHER PUBLICATIONS

Automatic method for fabricating a three–dimensional plastic model with photo–hardening polymer, by Hideo Kodama, Rev. Sci. Instrum. (52)11, Nov. 1981, pp. 1770–1773.

Solid Object Generation, by Alan J. Herbert, Journal of Applied Photographic Engineering, vol. 8, No. 4, Aug. 1982, pp. 185–188.

A Review of 3D Solid Object Generation, by A. J. Herbert, Journal of Imaging Technology, vol. 15, No. 4, Aug. 1989, pp. 186–190.

Reexamination Certificate of U.S. Patent 4,575,330 (Published Dec. 19, 1989).

*Primary Examiner*—Leo B. Tentoni
*Attorney, Agent, or Firm*—Thomas H. Magee

[57] ABSTRACT

A method and apparatus, where high viscosity liquids, including pseudoplastic, plastic flow, and thixotropic liquids, as well as gels, semi-solid, and solid materials are viscosity reduced during coating and allowed to increase in viscosity during imaging steps, for use in Solid Imaging applications. Use of these materials and the apparatus improves coating uniformity and final object tolerances.

18 Claims, 4 Drawing Sheets

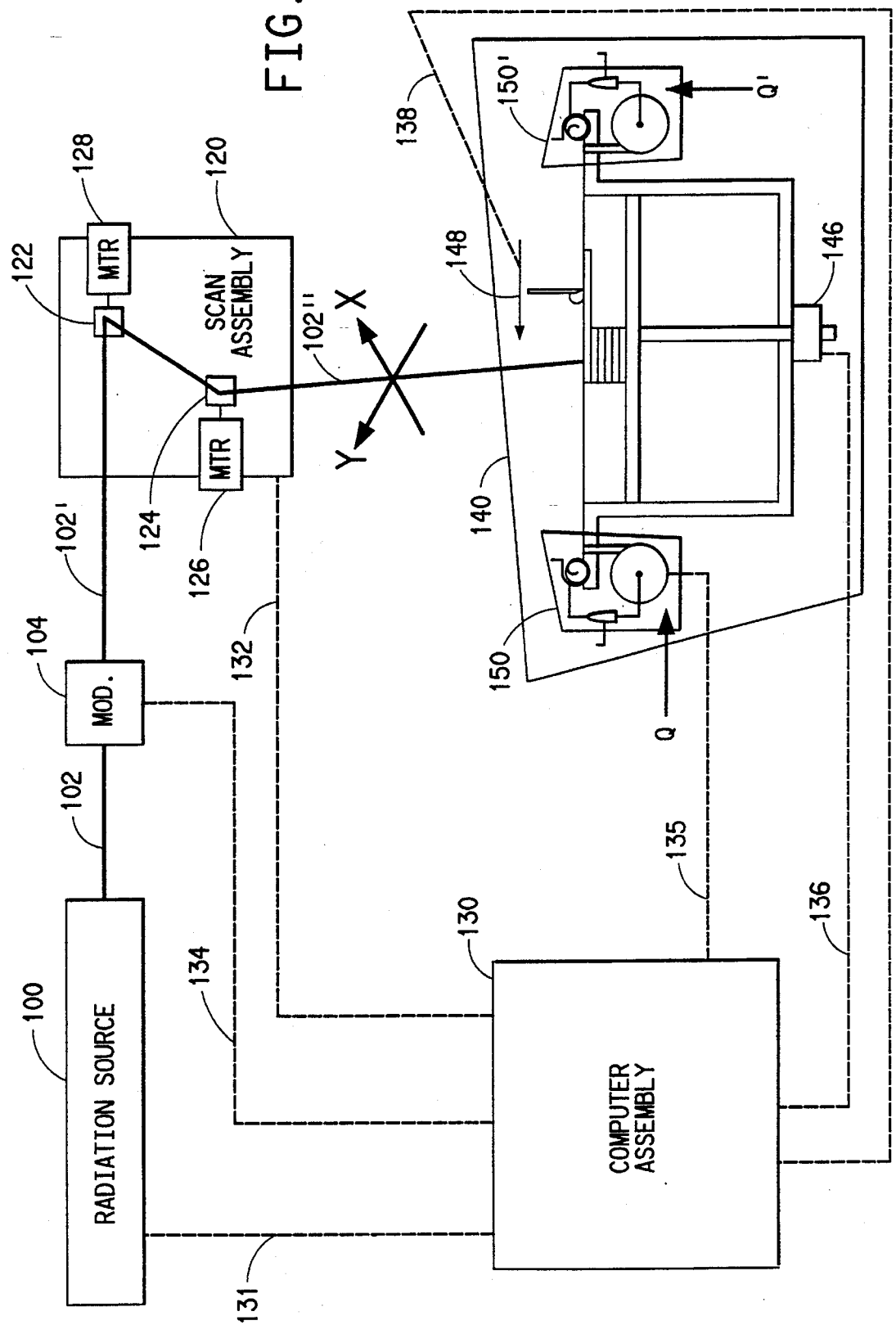

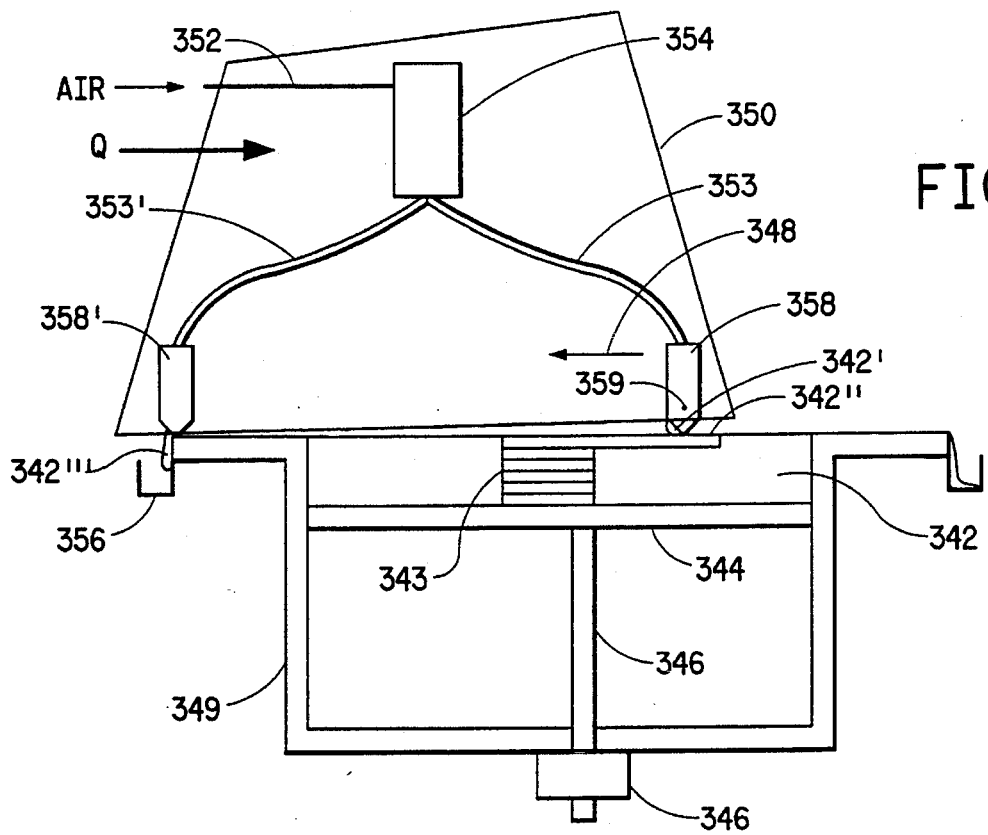
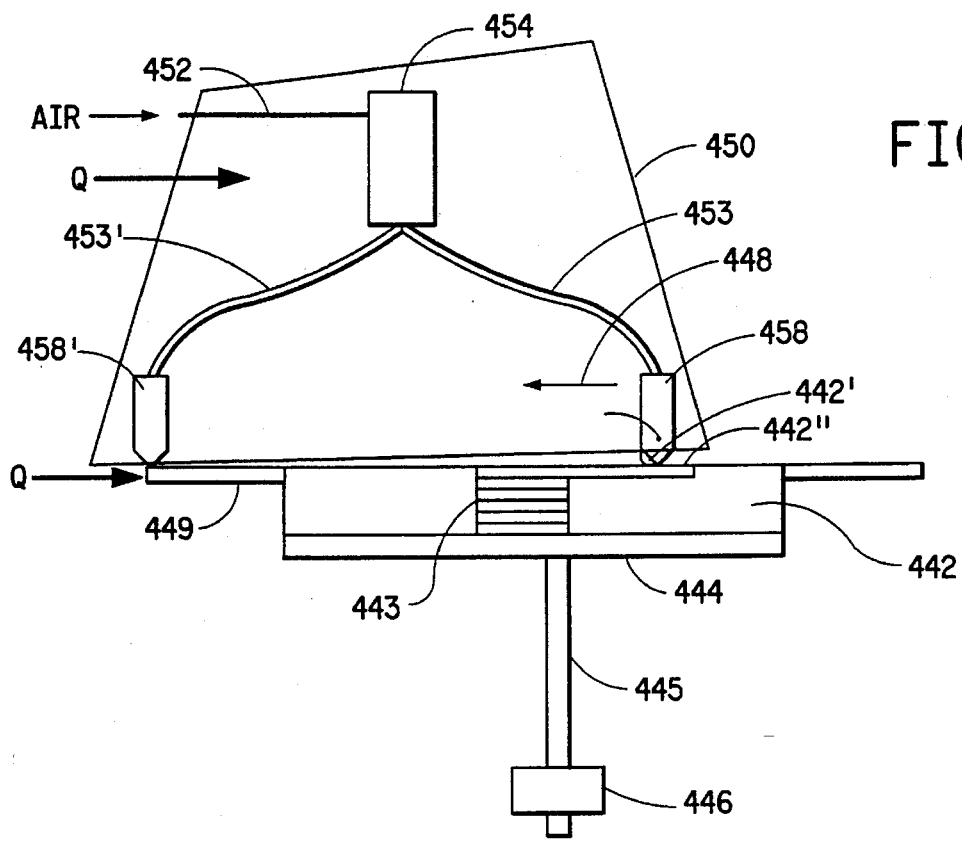

METHOD FOR FORMING SOLID OBJECTS UTILIZING VISCOSITY REDUCIBLE COMPOSITIONS

FIELD OF INVENTION

This invention relates to methods and apparatus for coating viscosity reducible compositions useful in the formation of solid objects by Solid Imaging means. More specifically, herein are disclosed methods and apparatus for coating heat liquefiable, pseudoplastic, plastic-flow, and/or thixotropic compositions in uniform thin layers thereby allowing the production of solid objects, with improved accuracy and speed, by Solid Imaging means.

BACKGROUND OF THE INVENTION

Many systems for production of three-dimensional models by photohardening have been proposed. These approaches relate to the formation of solid sectors of three-dimensional objects in steps by sequential irradiation of areas or volumes sought to be solidified. Various masking techniques are described as well as the use of direct laser writing, i.e., exposing a photohardenable composition with a laser beam according to a desired pattern and building a three-dimensional model layer by layer. In addition to various exposure techniques, several methods of forming thin liquid layers are described which allow either the coating of a platform initially or the successive coating of object layers previously exposed.

U.S. Pat. No. 4,575,330, (C. W. Hull), issued on Mar. 11, 1986, and later reexamined (certificate issued on Dec. 19, 1989), describes a system for generating three-dimensional objects by creating a cross-sectional pattern of the object to be formed at a selected surface of a fluid medium capable of altering its physical state in response to appropriate synergistic stimulation by impinging radiation, particle bombardment, or chemical reaction, wherein successive adjacent laminae, representing corresponding successive adjacent cross-sections of the object, are automatically formed and integrated together to provide a step-wise laminar buildup of the desired object, whereby a three-dimensional object is formed and drawn from a substantially planar surface of the fluid medium during the forming process.

Publication "Automatic Method for Fabricating a Three-Dimensional Plastic Model with Photohardening Polymer" by Hideo Kodama, Rev. Sci. Instrum. 52(11), 1770–1773, Nov. 1981, describes a method for automatic fabrication of a three-dimensional plastic model. The solid model is fabricated by exposing liquid photo-forming polymer, of 2 mm thickness or less, to ultraviolet rays, and stacking the cross-sectional solidified layers. Publication "Solid Object Generation" by Alan J. Herbert, Journal of Applied Photographic Engineering, 8(4), 185–188, August 1982, describes an apparatus which can produce a replica of a solid or three-dimensional object much as a photocopier is capable of performing the same task for a two-dimensional object. The apparatus is capable of generating, in photopolymer, simple three-dimensional objects from information stored in computer memory. A good review of the different methods is also given by a more recent publication, titled "A Review of 3D Solid Object Generation" by A. J. Herbert, Journal of Imaging Technology 15:186–190 (1989).

Most of these approaches relate to the formation of solid sectors of three-dimensional objects in steps by sequential irradiation of areas or volumes sought to be solidified. Various masking techniques are described as well as the use of direct laser writing, i.e., exposing a photoformable composition with a laser beam according to a desired pattern. In addition to various exposure techniques, several methods of forming thin liquid layers are described which allow both coating a platform initially and coating successive layers previously exposed and solidified.

Such methods of coating suggested thus far, however, have drawbacks in that they are not capable of ensuring flat uniform layer thickness or of producing such layers quickly, or they do not effectively prevent damage to previously formed layers during the successive coating process. Furthermore, most previous methods omit to recognize very important parameters involved in the coating process such as, for example, the effects of having both solid and liquid regions present during the formation of the thin liquid layers, the effects of fluid flow and rheological characteristics of the liquid, the tendency for thin photoformed layers to easily become distorted by fluid flow during coating, and the effects of weak forces such as, for example, hydrogen bonds and substantially stronger forces such as, for example, mechanical bonds and vacuum or pressure differential forces on those thin layers and on the object being formed.

The Hull U.S. Pat. No. 4,929,402, for example describes a dipping process where a platform is lowered either one layer thickness or is dipped below the distance of one layer in a vat then brought up to within one layer thickness of the surface of the photohardenable liquid. Although theoretically most liquids will flatten out due to surface tension effects, high viscosity liquids and even low viscosity liquids take an inordinate amount of time to flatten to an acceptable degree especially if large flat areas are being imaged and if the liquid layer thickness is very thin. Regions where previous layers consist of solid walls surrounding liquid pools further compounds the flattening process of the thin liquid layer coating. In addition, motion of the platform and parts, which have cantilevered or beam (regions unsupported in the Z direction by previous layer) sections, within the liquid creates deflections in the layers contributing to a lack of accuracy in the finished object.

The Munz patent (U.S. Pat. No. 2,775,758, issued in 1956) and Scitex application describe methods by which the photohardenable liquid is introduced into the vat by means of a pump or similar apparatus such that the new liquid level surface forms in one layer thickness over the previously exposed layers. Such methods have all the problems of the Hull methods except that the deflections of the layers during coating is reduced.

Pertinent art relative to viscosity reducible compositions and shear-thinning compositions, including viscosity reducible photopolymer compositions, exists. However, previous compositions have been developed to solve substantially different problems than those encountered in Solid Imaging. For example, inks and paints have been formulated to be shear-thinning to prevent sagging and smearing after application. These problems of sagging and smearing are not a primary consideration in Solid Imaging processes. However, as will be seen in the disclosure to follow, the shear-thinning properties of these compositions provide significant advantages, unanticipated by the prior art, when the substantially different problems and considerations inherent in the substantially different Solid Imaging process are taken into account.

The nature of viscosity reducible compositions used in a Solid Imaging process, as taught in this disclosure, entails that the composition must at some time be of relatively high viscosity during the practice of the invention described herein. However, other pertinent art, such as Hull in U.S. Pat. Nos. 4,929,402 and 4,575,330, European Patent Applications EP 0 355 944 A2, WO 89/10254, WO 89/10255, WO 89/10249, and EP 0 354,637, teach away from the use of high viscosity compositions in the practice of Stereolithography. In addition, the DeSoto patents, such as for example U.S. Pat. Nos. 4,844,144, 4,945,032, and 4,942,001, (Murphy et al.) all teach that low viscosity compositions are necessary for the Stereolithography process. Likewise, Laid-Open-To-Public Japanese Patent Application No. Hei 1(1989)-204915, of Japan Synthetic Rubber Co. (Kobayashi et al.) teach that low viscosity compositions are required. Similarly, a Japanese patent application Kokai Patent No. 14133 from Mitsubishi (Maruya et al.) teach heating of substantial portions of the composition in a vat to lower the composition viscosity and thereby improve the speed and sensitivity of the composition in a Solid Imaging process. Similarly, Sony has filed a European Patent Application, Publication No. 0 376 571 that teaches ways to lower the viscosity of the composition used in a Solid Imaging apparatus by various methods of heating the composition. Clearly, experts in the art teach that photopolymer compositions, used in a three-dimensional layer upon layer processes, are preferably low in viscosity. This is typically true for all apparatus that employ low shear coating methods.

On the other hand, in a recent European Patent Application Publication No. 0361847 by 3-D Systems (Almquist et al.), wherein a doctor blade is utilized to form flat photopolymer composition layers, moderately higher viscosity compositions are generally recommended. However, to avoid the hydrodynamic effects involved in using these moderate viscosity compositions, mechanical fix recommendations are made, such as raising the object under manufacture above the level of the composition surface in the vat and scraping the blade over just the object to remove the composition without scraping the remaining composition in the vat, varying the speeds of blade coating, and/or utilizing multiple blade passes. Although, the doctor blade is a higher shear application method (in comparison to allowing the composition to flow naturally over a surface) there is no indication that their disclosure coupled a high shear coating method and apparatus with an appropriate shear-thinning composition. In fact, sections which describe the movement of a doctor blade and the velocities of the liquid composition at a distance from the blade indicate that shear-thinning compositions are not anticipated. Similarly, Japanese Patent Application Publications Kokai 61-114817 and 61-114818 (Morihara and Abe) from Fujutsu also indicate that higher viscosity compositions may be utilized with a doctor blade type apparatus, but make no mention of shear-thinning compositions and afford no indication of thickness of layers produced, amount of layer uniformity achieved, or the range of viscosity used and recommended.

Japanese Patent Application Publications Kokai 61-114817 and 61-114818 (Morihara and Abe) from Fujutsu also describe apparatus wherein a predetermined amount of liquid photo-setting resin is deposited within a container through an elongated supply opening. In one case, the liquid is laid as a uniform coating within the container to form the layers, and in another case, the liquid is deposited in the container and smoothed out with a smoothing plate (doctor blade). In both these cases, it is important to deposit a predetermined amount of liquid in the container. Too much liquid will cause either thicker layers than desired, or in the case of the smoothing blade, an excess of resin in the container at the end of the blade stroke. Too little liquid will cause thinner layers than desired, or in the case of the smoothing blade, a non-uniformly coated layer due to voids. 3-D Systems, in their European Patent Application 0 361 847, also has higher vat walls to contain the composition. In their disclosure, the composition is applied in excess by dipping the object surface below the composition surface level, however, the excess composition is not first added to the surface of the vat region and then removed by the doctor blade. Apparatus for the invention described herein, however, allow for the deposition of excess photoformable composition which can be directly removed by the extrusion head supplying the composition, or a doctor blade spreading the composition, or by other means. This is possible since the coating and imaging is performed at the surface of the vat, not in a region contained by higher vat walls, and therefore the excess composition can be scraped from the vat surface, collected, and recycled for use during fabrication of the object.

There is a French Patent 2583333 by an inventor Cilas Alcatel in which a nozzle is utilized to deposit pattern-wise a controlled amount of thixotropic photoformable composition on a surface. The resin is exposed and hardened as it is deposited. For reasons similar to those described above, the apparatus described in the Alcatel patent must apply only a predetermined amount of composition from the nozzle. If more or less composition is applied in this case, there will be a severe loss of accuracy. In addition, the use of a thixotropic composition in the Alcatel patent is for substantially different reasons than reasons disclosed in the invention described herein. In the Alcatel process, the composition must be deposited and stay deposited in the pattern-wise applied location at least until it is photohardened. The thixotropic behavior of the Alcatel compositions ensures that the composition retains its placed position during this intermediate period. However, for the invention disclosed herein, the composition is not applied pattern-wise and the thixotropic composition is being utilized to reduce distortions and to provide support to previously photoformed layers during coating.

In a recently issued U.S. Patent by Scitex Corporation Ltd. Pat. No. 4,961,154, (Pomerantz et al.) there is disclosed an apparatus employing a method of supporting an object, being fabricated layer by layer, wherein a second non-photosensitive liquid is supplied to both support the object layers and control the depth of photo-solidification of the individual layers. This non-photosensitive liquid may be a heated wax which presumably cools to a solid after application. Such art is only slightly pertinent to an embodiment of the invention described herein, where a heat liquefiable photoformable composition is applied as a viscosity reduced liquid, then allowed to cool to form a high viscosity or solid photoformable layer.

Also, pertinent to the use of thermoplastic photoformable composition processes are U.S. Pat. Nos. 3,264,103 and 3,395,014, (Cohen and Webers) issued in 1966 and 1968 respectively. In these patents, processes are disclosed in which a thermoplastic photohardenable composition is applied, in thin layers as a solution, to a film and then allowed to dry. This coated film is then exposed with UV or visible light imagewise from the film side thereby cross-linking the exposed portions. Next, typically a porous substrate, such as for example a felt, is placed on the coating side and the materials are heated by various means causing the unexposed portions of the composition to soften while the exposed portions, with a higher melting temperature, do not soften. By applying a pressure or a pressure differential between the film side and the felt side, the unexposed composition is blotted up by the felt and a three-dimensional relief surface is created on the film side. This process is directed primarily toward the production of printing plates, however, relief maps and "3-dimensional replicas of a photohardened relief image can be formed by application of heat and a pressure gradient to successive sheets of thermoplastic films in contact with said photohardened relief image". The processes described however, do not teach of applying the thermoplastic composition by heated coating means and do not teach the removal of the unexposed portions of the composition after several layers have been successively laid down and imaged as is taught in the disclosed invention herein. In addition, such "3-dimensional relief replicas" are actually contoured surface replicas rather than three-dimensional objects as described in the instant invention.

SUMMARY OF INVENTION

This invention provides unique solutions to the above described coating problems by utilizing a viscosity reducible photoformable composition, such as, for example, a heat liquefiable, pseudoplastic, plastic, or a thixotropic photoformable composition in combination with coating techniques designed to take advantage of the flow characteristics of these compositions. For the purposes of the invention disclosed herein, a viscosity reducible composition is a composition that is capable of becoming reduced in viscosity if heated, if a shear stress is applied, or if a combination of heat and shear stress is applied to the composition. A viscosity reduced composition should be understood as being presently reduced in viscosity by having been raised in temperature by heat, having had shear stresses recently applied, or having had both recent shear stresses and heat applied. Furthermore, a viscosity reduced composition becomes a viscosity reducible composition by cooling and/ or by reducing the rate of applied shear. Heat liquefiable compositions used in Solid Imaging are compositions that are relatively high viscosity or solid during the imaging steps, but that can be coated in thin layers as a lower viscosity composition if heated during the coating step. The term "liquefiable" should be distinguished from something that is melted, since melting may infer that all components of the composition have been rendered liquid. A liquefied composition may have some components that are still, for example solid or crystalline, but which components are made fluid by other components in the composition that have been melted by heating. For the purposes of the invention disclosed herein, the description "high viscosity" should be understood to mean a liquid, a semi-solid, a gel, or a solid composition which exhibits either a yield value of 10 dynes/cm$^2$ or greater as a shear stress is applied, or which exhibits a viscosity of 7000 centipoise or greater at a very low shear rate of $\leq 0.3$/sec, assuming that testing occurs after an adequate no-shear-stress holding period in order to eliminate thixotropic effects, and that the composition is in a viscosity reducible state. Pseudoplastic compositions exhibit shear-thinning properties of flow, that is, if a portion of the composition medium is caused to move or flow, an interface region, between the moving portion and the remainder of the medium, decreases in apparent viscosity. The apparent viscosity decreases as a function of increasing shear rate. This lowering in apparent viscosity in this interfacial region, while the remainder of the medium retains substantially the same apparent higher viscosity, helps to ensure that the composition flow occurs primarily at the interface region, or slip zone, and that the flow is quickly damped in the remainder of the medium. Similarly, as defined for this invention, in plastic flow (Bingham body) compositions there is a decrease in viscosity in the interfacial region after a certain yield stress has been overcome. Typically, for pseudoplastic and plastic flow the apparent viscosity will again increase immediately (assuming no substantial thermal increases have occurred due to work performed at this interface) once the shear rate is reduced. However, should the apparent viscosity not immediately increase upon reduced shear rate, the composition will be termed thixotropic. Pseudoplastic, plastic, and thixotropic types of flows are differentiated from Newtonian flows in that, with a Newtonian flow, a shear applied to one portion of the medium usually creates some motion in regions somewhat distant from the shear interface region. Also, for Newtonian flow materials, viscosity is independent from shear.

Many of the unique problems associated with coating in the Solid Imaging process are substantially alleviated when these viscosity reducible compositions are utilized in conjunction with appropriate coating methods and apparatus such as described herein.

The use of heat liquefiable coatings in a Solid Imaging process represents a significant departure from other art where liquid compositions are specified. In such a process, a platform is coated with a liquefied photoformable composition in a thin layer. After application, this layer is allowed to cool causing it to increase in viscosity or solidify. Next, the layer is exposed imagewise with appropriate radiation causing a degree of photoformation that substantially decreases the heat liquefiability of the layer where imaged. Next a new liquefied composition layer is applied to the previous layer, and the layer is allowed to cool and the imaging step occurs. This series of steps is repeated until all cross-sections of a three-dimensional object have been produced. Finally the layers of heat liquefiable (but cooled and therefore high viscosity or solid) composition and photoformed layers are removed form the platform substantially as a single mass. This mass is placed in an oven, for example, and heated in order to lower the viscosity of the heat liquefiable unexposed composition layers and in some cases in order to complete the photoformation of the exposed layers of the object. Once the heat liquefiable composition has lower viscosity it is more easily removed from the solid object that was photoformed. The advantages of such a process are, to name a few; the virtual elimination of hydrodynamic coating problems inherent in other systems and the elimination of distortion due to having substantially unsupported portions of an object during fabrication.

Since shear-thinning non-Newtonian compositions typically exhibit a greater reduction in interfacial apparent viscosity at greater shear rates, apparatus that applies the shear quickly as a part of the coating process not only speeds the Solid Imaging process but also provides improved coating uniformity. The use of such coating speeds with an apparatus that coats a Newtonian composition would result in undesirable hydrodynamic effects and decreased coating uniformity. Therefore, herein are described novel methods and apparatus for applying such shear-thinning non-Newtonian compositions in thin layers quickly.

The advantages of viscosity reducible compositions used in conjunction with suitable coating apparatus are disclosed herein. For the purposes of this summary, however, these advantages, which are discussed in more detail herein, are listed as follows:

a. Reduced distortion due to surface tension effects between the photoformed layers, the photoformable composition and the air interface.

b. Reduction of defects in coating uniformity due to hydrodynamic effects.

c. Reduced deflection of substantially unsupported layer sections such as cantilevered layers and simply supported layer portions.

d. Minimized runback flow of the photoformable composition after application.

e. Improved stability of the composition. There is less tendency for the settling of different dispersed components within the photoformable composition.

f. Improved coating speeds.

g. Reduced quantity of photoformable composition required during the Solid Imaging process.

Therefore, herein is disclosed a method and apparatus for forming a three-dimensional object comprising the steps of:

a) coating a layer of viscosity reduced photoformable composition on a surface;

b) allowing said layer to become a viscosity reducible composition layer;

c) exposing said layer to radiation imagewise by radiation means in order to photoform said layer imagewise;

d) coating a new layer of viscosity reduced photoformable composition over said previously coated layer;

e) allowing said new layer to become a viscosity reducible composition layer;

f) exposing said new layer to radiation imagewise in order to photoform said new layer imagewise; and, g) repeating steps d) through f) until the three-dimensional object is formed.

BRIEF DESCRIPTION OF THE DRAWING

FIG. 1 depicts the overall schematic of a preferred embodiment of the invention.

FIG. 3 shows a more preferred coating station in which excess applied composition is extruded, smoothed and recovered.

FIG. 4 depicts a coating station that may prove useful in coating viscosity reducible solid or semi-solid compositions in a Solid Imaging operation.

DESCRIPTION OF PREFERRED EMBODIMENT

Figure 2A:
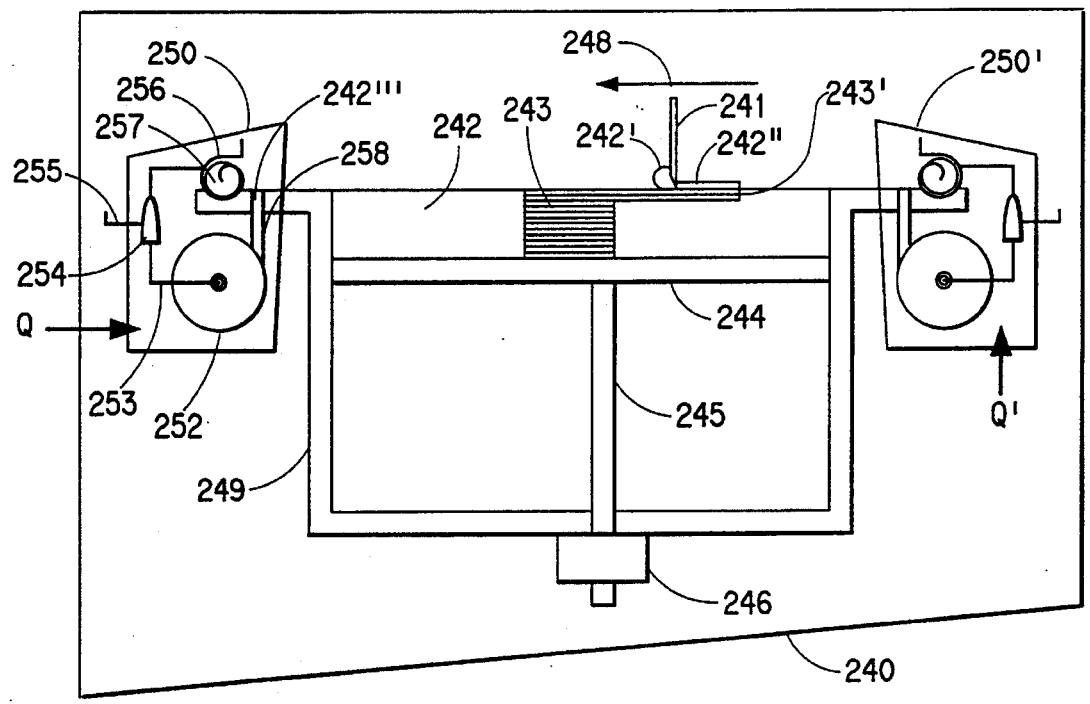
FIG. 2A shows a more detailed view of a preferred coating device useful in applying viscosity reducible photoformable compositions in a Solid Imaging application.

The coating steps in a Solid Imaging process typically are a major contributor of loss of accuracy or tolerance in the solid objects being formed. The thickness and the uniformity of thickness of layers utilized in the making of solid objects by Solid Imaging means often defines the minimum tolerance that can be achieved in the final object. In addition, deflections and motions of substantially unsupported portions of object layers during construction often lead to gross inaccuracies in the solid object produced. This disclosure of viscosity reducible compositions utilized in conjunction with methods and apparatus for coating these compositions in a Solid Imaging process provides a means of producing accurate solid objects quickly.

The Summary of Invention describes three types of shear-thinning non-Newtonian compositions that may prove useful in the Solid Imaging process. The first type mentioned is a pseudoplastic composition. Examples of pseudoplastic liquids are molten polyethylene and polypropylene, solutions of carboxymethylcellulose (CMC) in water, polyacrylamide in water and glycerin, and aluminum laurate in decalin and m-cresol. Some paints, greases and pastes are examples of plastic flow type mixtures. Peanut butter is often used as an example of a material with with plastic flow or semi-solid characteristics. Common examples of thixotropic materials (or materials that show pseudoplastic or plastic flow behaviors which change with duration of shear and typically recover their viscosity after a period of time when shear is reduced or no longer present) are materials such as mayonnaise, drilling muds, some paints, and inks. For the purposes of this invention, a solid will have a yield value of greater than $10^4$ dynes/cm$^2$ and a low-shear rate viscosity of greater than $10^4$ poise. A semi-solid will have a yield value of greater than $10^3$ dynes/cm$^2$ and a low-shear rate viscosity of greater than $10^3$ poise. A gel will have a yield value of greater than 100 dynes/cm$^2$ and a low-shear rate viscosity of greater than 0.1 poise. It should be assumed that these values are for standard conditions.

The Solid Imaging process involves the positioning of a translatable platform in a vat of photoformable composition such that a thin layer of composition, typically on the order of from 0.001" to 0.03" thick, covers the surface of the platform. Usually the surface of the photoformable composition covering the platform is substantially co-planar with the surrounding surface of the composition in the vat. (Hereinafter, photoformable composition(s), or simply composition(s), refers to deformable compositions that harden or increase in viscosity upon exposure to specific radiation to which it has been sensitized. And, the term deformable refers to the initial state of the composition prior to exposure, that state being, for example, a liquid, a gel, a semi-solid, a solid, a paste, etc. such that the shape of the material can be substantially modified by, for example, gravitational forces, applied pressure, applied shear stress, applied heat, or a combination of these. And, a photoformed layer or part is created by, for example, solidifying, increasing the viscosity, or sintering the photoformable composition by exposure to radiation.) Also, surface tension effects are usually relied upon to provide a uniformly flat coating on the platform. In cases where just surface tension is relied upon for flattening of the layer, low viscosity liquid photoformable composition liquids are preferred since the time for these liquids to flatten is much shorter than the flattening time for higher viscosity liquids. Next, the thin composition layer on the platform may be subjected to imagewise radiation by various means, such as for example, exposure with radiation through or reflected from a photomask, or direct write exposure with a scanning focused radiation beam. This imagewise radiation causes the photoformable composition to photoform, i.e., to gel, stiffen, harden, cross-link in the regions exposed. Then the platform, to which the photoformed layer substantially adheres, moves at least one layer further into the vat and a new layer of photoformable composition is caused to cover the previous photoformed layer and the previous photoformable composition that was not exposed. Another imagewise exposure occurs that typically provides enough exposure to imagewise photoform the new composition layer and to allow this photoformed layer to adhere to the previous layer in regions where the new photoformed layer and the previous photoformed layer have common coordinate positions in the image plane. This process of moving the platform down at least one layer thickness, causing a photoformable composition layer to cover the previous layer, and creating an imagewise exposure is continued until all layers necessary for representing the solid object are completed. Then the platform and formed object are raised and the formed object is removed from the platform, drained, cleaned, and post-processed as required.

The self-flattening behavior of typical photoformable compositions is often difficult or not possible to satisfactorily achieve within preferable time periods for the Solid Imaging process. Low viscosity liquids generally flatten out quickly, however, there is still an undesirable wait period for this flattening to occur even with low viscosity compositions, and many low viscosity compositions tend to have higher part shrinkage during photoforming. In addition, such low viscosity compositions are more sensitive to surface tension effects. For example, by way of describing a particular phenomenon and not necessarily as a definitive explanation of the reasons for the occurrence of a non-uniform flatness problem, the Applicant suggests that the following surface tension forces are present during self-flattening of a low viscosity liquid:

Consider for example a 1" cube which is formed by Solid Imaging means using a low viscosity photoformable composition. Many times during formation of such a part, the cube will become higher in the interior regions of the upper surface and drop off in height toward the edges of the object surface, as though the composition did not properly drain from the surface of the previous layer during the coating process.

Assume that during the coating process, the platform and the previously formed layers are dipped below the surface of the composition in the vat deeper than one layer thickness in order to expedite the flow of the composition over the previously photoformed layer surface, and then the the platform and layers are raised till the upper surface of the previous layer is within one layers thickness of the nominal composition layer. This means there is an excess of liquid composition on the previous layer that must drain off to allow the entire liquid layer surface to flatten. Usually the liquid composition will have a certain molecular polarity and the photoformed object will have a somewhat different molecular polarity. This difference in polarity introduces the potential for a liquid contact angle to be formed. As the excess liquid drains from the surface of the previous layer it will tend to constrict in thickness as it flows over the edge of the object. This constriction in the liquid thickness may become so thin that the wetting properties of the photoformable composition relative to the photoformed layer become dominant, causing a break in the flow of liquid draining from the layer surface and therefore the formation of a contact angle between the photoformed object and the composition located both on the surface of the previously photoformed layer and within the vat. In essence, the photoformable composition tends to bead up, thicker than desired, on the upper surface of the previously formed layer rather than draining off the surface until the draining composition levels in a plane with the rest of the composition in the vat.

Viscosity reducible compositions and apparatus for applying such compositions as described herein, do not solely rely on self-flattening effects to obtain coating uniformity, and such compositions are also less sensitive to surface tension forces that may arise and decrease the coating uniformity.

Some Solid Imaging processes have resorted to the use of a doctor blade which is drawn across the surface of the composition in order to spread the thin layers of composition uniformly. Such a coating means may improve the coating uniformity and speed, however some surface tension defects in the coating still arise. And with substantially Newtonian liquids, the doctor blade introduces significant hydrodynamic defects in the coating uniformity. A distinction should be made between coating with a doctor blade for essentially single layer applications and coating with a doctor blade with multilayer applications. Single layer doctor blade applied coatings can be extremely uniform if the substrate being coated is uniformly supported and if the substrate itself is uniformly smooth. In multilayer doctor blade coating of composition layers, both solid and liquid regions are being coated, so essentially the layer of composition being coated is applied to a non-uniform substrate, i.e., the previously photoformed region and the surrounding liquid composition. In single layer coating with a doctor blade, the process may be viewed as a liquid, with a head pressure on the advance side of the blade, i.e., ahead of the blade which is moving in a direction, which passes through an orifice defined by the edge of the blade and the substrate. If the substrate is uniformly supported and smooth, the orifice remains constant. However, in multilayer doctor blade coating, the orifice is sometimes defined by the distance between the blade and the previously photoformed layer, and at other times the orifice is loosely defined by a viscous flow resistance of unexposed composition with a depth under the blade. It is clear that with different types of flow constraints under the blade, the coating applied will necessarily be non-uniform. However, the use of viscosity reducible compositions with doctor-blade coating apparatus will lessen the difference between the orifice over photoformed regions and the orifice over the unexposed viscosity reducible composition, and therefore an improvement in coating uniformity can be expected. This is true with shear-thinning compositions especially if the doctor blade speed of application is quick, where the rate of application creates a greater decrease in viscosity in the slip zone of coating.

In addition, hydrodynamic effects reduce the uniformity of the coating of Newtonian compositions in Solid Imaging processes. For example, consider a doctor blade moving across the surface of a photoformable composition in which a series of photoformed layers and a platform are positioned in readiness for formation of a solid object by Solid Imaging means. Initially, the blade is in contact with the uppermost surface of the composition, positioned typically in a region not directly above the platform. As the blade begins to move linearly, it applies a shear force to the surface of the composition thereby causing the composition surface to move with a velocity and direction substantially the same as the doctor blade. If we view the velocity and direction of motion of regions of a Newtonian composition directly below the doctor blade, we would find that the velocity of the composition affected by the blade would decrease substantially linearly till it approaches another surface, for example, the bottom of the vat holding the composition, or for example, the top of the platform supporting the photoformed object layers, at which point it would substantially attain the velocity of that surface. The velocity profile attained by the composition, as a result of the doctor blade motion, essentially creates a region of composition flow with a momentum in a direction substantially parallel to the blade direction. When the doctor blade passes above the previously photoformed layer, the composition flowing with a momentum essentially comes up against a "wall", i.e., the edges of the object under formation. Some of the composition flows around the object and some of the composition creates a wave, with head pressure above the normal surface of the composition, which rises behind the blade, and creates a mound of excess composition on top of the previous layer of the object under formation. This wave mound is distinctive for doctor blade coated Solid Imaged objects and usually becomes more prevalent with objects that present high "walls" and have substantially large surface areas in the imaging cross-section. However, if for example, a suitable viscosity reducible composition is utilized with a doctor blade coating apparatus, the velocity of the composition at a short distance away from the doctor blade quickly approaches zero. Therefore, a substantial momentum of composition flow is not built up during doctor blade coating motion, and when the blade passes above the previously photoformed layer, a pressure wave is not formed and the coating applied over the previously photoformed layer is substantially flatter.

A related coating defect that occurs with doctor blading of a Newtonian composition is that of distortion of substantially unsupported layers. Substantially unsupported layers should be taken to mean, in this disclosure, that a portion of a layer of a given thickness is attached to a previous layer in some locations but overhangs, whether as a cantilever or a beam span, the previous layer by an overhang length dimension greater than the layer thickness dimension. The only support means of this overhang is the inherent support of the overhang due to its inherent stiffness and attachment means to the previous layer, and any support the composition, beneath the cantilever or beam span, may impart. As may be envisioned, referring to the previous two examples where the blade produces a head pressure in the composition in advance of the blade and the blade induces a wave and pressure head in the composition against a "wall" behind the blade, if a substantially unsupported cantilevered layer exists atop that "wall", the cantilevered overhang will first be pushed down by the head pressure of the composition before the doctor blade, and then, when the wave pressure hits the layer from below, the layer will be pushed up behind the blade. It can be further envisioned that all permutations of distortion in the overhang may occur should the blade be moved at fast or slow speeds, or should the overhang be coated from various blade directions of motion. On the other hand, if a viscosity reducible composition is utilized, the composition beneath the cantilevered overhang is essentially supported by a medium of relatively high apparent viscosity or by a solid medium, and therefore deflects less as the head pressure in advance of the blade motion passes over it. And, since there is essentially little or no pressure wave behind the blade, the overhang is not forced up behind the blade as the blade passes. Therefore, in the case of layers with an overhang, it is preferred to utilize a viscosity reducible composition to minimize overhang deflection. While it is more preferable to use a heat liquefiable and shear-thinning composition that when cooled forms a solid or semi-solid, just pseudoplastic compositions are also advantageous, and plastic flow compositions are preferred over pseudoplastic compositions since the head pressure in advance of the blade must overcome the yield stress of the composition below the overhang in order to create a deflection of the overhang. Also preferred, however, are plastic flow compositions that are also thixotropic. Such compositions have the advantage of not only being shear-thinning with a yield, but the residual low viscosity behavior characteristic allows for some degree of self-levelling or bubble escape even after relatively high shear rates are no longer directly affecting the applied composition layer.

After a coating application is made, for example with a doctor blade coating a Newtonian composition, some wait time is necessary for the system to stabilize to a flat surface condition. Lower viscosity liquids tend to stabilize more quickly than higher viscosity liquids however, a stabilizing wait time is still necessary. For example, as a doctor blade moves across the surface of a composition during a coating operation, it builds a head pressure ahead of its motion. Once the blade motion stops at the end of its sweep, this higher liquid level dissipates and flows back into the remaining composition. This essentially creates a transient change in level of the entire composition. Of course, with some viscosity reducible compositions this flow back and therefore transient change in level still may occur, however, there comes a time when the forces involved in leveling of the head pressure before the blade become so slight, due to viscosity increases, that the rate of change in composition level becomes negligibly small. This would be especially true of plastic flow type compositions, where the yield stress essentially arrests the leveling of the head pressure before the blade and the general composition level quickly stabilizes. And this is even more true with many heat liquefiable compositions where the cooling of the composition causes the viscosity to rise to a point where the flow back stops altogether.

Many photoformable compositions are comprised of materials that may not mix perfectly when placed in solution or in a dispersion. These different materials may tend to destabilize and come out of solution or dispersion over a period of time. Higher viscosity compositions will generally take longer to lose stability of the mixture. However, higher viscosity liquids are also more difficult to coat in thin layers. Viscosity reducible compositions provide the advantages of both needs; greater stability of the mix during most periods, while providing low apparent viscosity during coating in thin layers.

Another of the many advantages of shear-thinning non-Newtonian compositions for use in Solid Imaging is that for the most part, as the shear rate increases, the viscosity decreases. For most Solid Imaging coating applications therefore, shear rate increases translate to faster coating times in addition to improved coating uniformity. For example, assume that an object is being manufactured by Solid Imaging means, and surrounding the object is the unexposed viscosity reducible composition. In preparation for formation of the next layer of the object, the object and the surrounding composition is displaced relative to a vat surface by approximately 0.01". Next, a viscosity reduced composition is deposited in excess quantities on the surface of the object and the surrounding viscosity reducible composition. Finally, assume that a doctor blade is utilized to scrape off the excess viscosity reduced composition from the surface of the vat such that a 0.01" thick layer of viscosity reducible composition uniformly covers the object and the previously coated viscosity reducible composition. It might be estimated that the shear rate experienced by the viscosity reduced composition during the doctor blade motion is the speed of the blade divided by the thickness of the layer being applied (which in this case is 0.01"). Therefore if the speed of the blade is 1 inch/sec, the shear rate would be 100/sec. However, for many compositions that do not show substantial thixotropy and yet are shear thinning, the moment the viscosity reduced composition is deposited in excess quantities it becomes viscosity reducible. In many of these cases, when the doctor blade scrapes off the excess composition, the shear stresses and composition flow occurs in a slip zone less than the thickness of a layer. In such a case, for example, if the slip zone is constrained to a 0.001" thick region and the doctor blade moves at 1 inch/sec, the shear rate is 1000/sec. Although, the considerations are complex, it is generally preferred to apply shear rates of equal to or greater than 100/sec. However, for the purposes of this invention, a low shear rate will be, ≦0.3/sec, a moderate shear rate will be 0.3/sec to 1000/sec and a high shear rate will be greater than 1000/sec.

A preferred embodiment of this invention is illustrated in FIG. 1. There is provided an imaging station means including a radiation source 100, a radiation beam 102 emanating from the radiation source 100, a modulator 104, a modulated beam 102', and a scanned beam 102". There is also provided a scanning assembly 120 comprising a Y direction scan motor 128 with a Y direction scan mirror 122, and an X direction scan motor 126 with an X direction scan mirror 124. The modulated beam 102' reflects off the Y direction scan mirror 122 and the X direction scan mirror 124 thereby producing scanned beam 102". There is also provided a coating station 140 shown in more detail in FIG. 2A, but in FIG. 1 the station 140 is shown with a photoformable composition handling assembly 150 and 150', a doctor blade translation means 148, and a platform translation means 146 (shown as an arrow for simplicity). A means for providing heat is shown with an Q or Q' and an arrow pointing into the composition handling assembly 150 and 150'. Also provided is a computer assembly 130 adaptable to generate and store CAD (computer aided design) data, slice said data into data sets representing specific thicknesses of cross-sections of a three dimensional object, and control the motion of scanning beam 102" by means of scan assembly 120 through scanner communication line 132. In addition computer assembly 130 controls the radiation source 100 through laser communication line 131, the modulator 104 through modulator communication line 134, the photoformable composition handling assembly 150 through handling communication line 135, the platform translation means 146 through platform communication line 136, and doctor blade translation means 148 through blade communication line 138. Radiation means 100 is preferably a laser, producing a radiation beam 102. Being desirable to produce solid objects at high speed, the apparatus of the instant invention preferably utilizes relatively high power radiation means 100, such as, for example, a high power laser, which may have major wavelengths in the visible, infrared, or ultraviolet regions. High power is considered to be a power greater than 20 mW, and preferably over 100 mW as measured from the intensity of radiation beam 102. This is so with the present photospeeds of photoformable compositions. However, as faster compositions become available, the values of 20 mW and 100 mW for the beam intensity will become lower accordingly, since photospeed of the composition and exposure from the radiation have an inverse relation to each other in order to achieve the same results. The selection of a certain type of laser should be coordinated with the selection of the photoformable composition in a way that agrees reasonably well with the wavelength of the laser's emission. Other types of radiation means may also be utilized such as, for example, electron beams, x-rays, radio waves such as, for example, microwaves, and the like, as long as their energy type is matched with the sensitivity of the photoformable composition, and the appropriate conditions for their handling are observed according to established ways, well known in the art. Although, means may be provided to modify the shape of the beam cross-section, of a laser for example, to any desirable shape, the preferred ordinary shape is circular, and the profile of the intensity of the beam is substantially gaussian with a maximum at the center of the circular shape.

In the preferred application of the invention as shown in FIG. 1, the scan assembly 120 and the driving electronics, contained as a part of the computer assembly 130, which controls the pointing of the scan assembly 120 and also generates the signal 134 to drive the modulator 104 is manufactured by Greyhawk (Greyhawk Systems, Inc., 1557 Centre Point Drive, Milpitas, Calif. 95035). With such a system, the type of scanning is vector scanning. During vector scanning the rotation of the mirrors 122 and 124 varies from an angular velocity of zero to a maximum angular velocity. This causes the velocity of the scanned beam 102" at the surface of the composition within the coating assembly 140 to vary from a velocity of zero to a maximum velocity. The Greyhawk scanner creates a signal which is modified to pulse the modulator 104 such that a proportioned time length of pulse is given for a given distance the beam 102" has traveled in the image plane. Since the pulse generated causes the modulator 104 to allow a pulse of radiation beam 102 to pass, the result is a substantially uniform amount of exposure when scanning the composition in the image plane. This uniform amount of exposure ensures a uniform depth of photoformation in the composition and therefore improved object tolerances. The radiation beam 102, modulated beam 102' and scanned beam 102" are shaped and focused by optics (not shown) to ensure efficient operation of the modulator 104, and high resolution capability exposure at the composition surface.

The presently preferred radiation source 100 is a Coherent Model 306, with output in wavelengths ranging over 351 nm to 363 nm and a specified output beam 102 power of approximately 450 mW. The presently preferred modulator 104 is an acousto-optic modulator and driver Model ME-75T and AOM-70U respectively, produced by IntraAction Corp., Bellwood, Ill. Coupled with the Greyhawk scanner electronics, is a digital computer capable of communicating with the other parts of the system and capable of outputting HPGL or CalComp files to the Greyhawk electronics.

FIG. 2A exhibits an enlarged view of the coater assembly 240 shown in FIG. 1 as coater assembly 140, both of which are shown during the viscosity reducible (by heating and/or induced shear) composition coating step. The coater assembly 240 in FIG. 2A comprises a vat 249 which in this case is also a cylinder (in the sense of a chamber where a piston moves, and not necessarily cylindrical in shape) in which a movable platform 244 (acting as a piston) moves slidably, being moved by, for example, a drive screw 245 and platform translation means 246, which is fixed to vat 249. Many suitable platform translation and drive means may prove useful, such as for example, hydraulic drives, piezoelectric linear drives and the like well known in the art. In the case of this particular embodiment, the platform 244 supports both the photoformed object 243 and the photoformable composition 242. Shown is a relatively unsupported layer 243' which obtains support by its own stiffness and the support provided by the unheated and unsheared viscosity reducible composition 242. Doctor blade 241 translates in a direction shown by translation means arrow 248, but actually the direction of motion is reversible allowing application of the bead of applied composition 242' to be applied from either left to right or right to left. Typically blade translation means 248 consists of a series of support rods and bearings (not shown for clarity) for holding the doctor blade 241 such that the length of the blade and the edge of the blade when translating describes a flat plane across the shown surface of vat 249. The blade translation means 248 drive mechanism (not shown for clarity) may be, for example, hydraulic, stepper motor, belt and series of pulleys, drive screw and motor, piezoelectric, etc., or any method known in the art. Behind the doctor blade 241 a composition layer 242" is formed which is substantially co-planar with the plane described by the movement of the doctor blade 241 edge and substantially close in distance to this edge plane. Different rheological characteristics of the composition 242, coating application speeds of the doctor blade 241, application temperature conditions, and doctor blade 241 edge shapes play into the actual distance between the applied composition 242" surface plane and the plane described by the doctor blade 241 edge movement. In advance of the doctor blade 241 is the application composition 242' which receives shear forces by the motion of the blade 241 and especially receives shear forces as portions of the application composition 242' are applied passing through the effective gap or orifice made between the blade 241 edge and the previously coated surface of composition 242 or the surface of previously photoformed layer 243. The blade 241 may also provide heat to the applied composition 242, either by a separate heating means or by residual heat picked up during the steps shown in FIG. 2B.

Figure 2B:
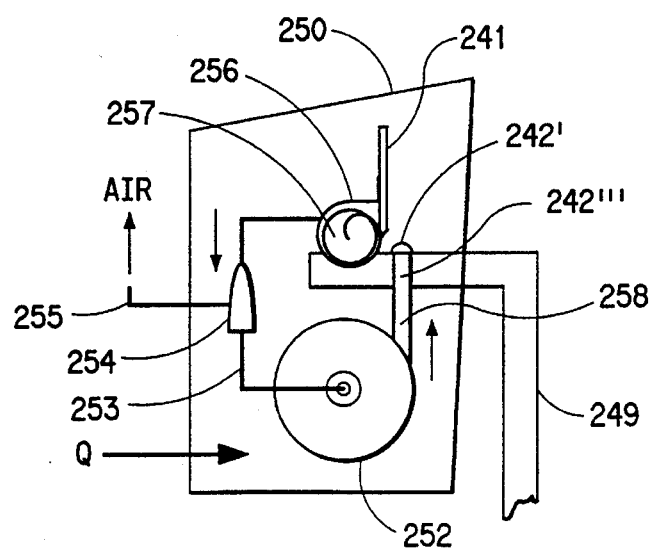
FIG. 2B shows further detail of the coating apparatus of FIG. 2A showing a preferred means of supplying excess applied composition prior to coating and a means of recycling excess composition subsequent to the coating operation.

FIG. 2B shows an enlarged view of the photoformable composition handling assembly 250 also shown in FIG. 2A, however, FIG. 2B shows the doctor blade 241 abutting a screw conveyor shroud 256, which acting with conveyor screw 257, removes any excess applied composition 242" (shown in FIG. 2A) and transports it to a degassing and composition storage/supply chamber 254 where any air picked up is removed through tube 255 by vacuum means or the like. Pump 252 draws the supply composition 242''' from the chamber 254 through tube 253 and pumps it through tube and linear extrusion opening 258 above the vat 249 (shown in section view) surface forming a new amount of applied composition 242'. The conveyor screw 257 is preferably an elastomeric "thread" material that substantially scrapes the doctor blade 241 surface by rotation of the screw 257. A similar embodiment of the composition handling assembly 250 as that shown in FIG. 2B exists on the opposite side of the vat 249 shown in FIG. 2A as composition handling assembly 250'. Heat shown as Q and Q' with an arrow may be supplied to the composition handling assembly. This heat Q or Q' may also raise the temperature of the doctor blade 241.

Naturally many possibilities exist as alternatives to the shown viscosity reducible photoformable composition handling apparatus shown in the Figures. For example, the essential operations, such as removal of the excess applied composition from one side of the doctor blade, may be accomplished with compositions that, while still viscosity reducible compositions, are nevertheless capable of flowing by their own weight, and therefore all that is necessary is to allow the doctor blade to rest over a region of the vat where the composition can flow from the blade and be collected. Or for example, in place of a screw conveyor scraper, a linear scraper could be run along the side of the doctor blade to remove excess applied composition left over from the previous coating operation. Or for example, the blade could be pressed against a stop that forces the excess composition to pass under the blade to the opposite side of the blade, then this composition would be combined with new applied composition in preparation for the next coating step.

Also, alternative methods of supplying new applied composition in advance of the doctor blade, might be for example, to have the operator lift the viscosity reducible photoformable composition in a container to a height and therefore allow the composition to flow by gravity, for sufficiently low viscosity compositions, as needed and as controlled by a valve. Or for example, the composition could be pumped from a pressure tank when needed. Or for example, the composition could be squeezed from a tube while the tube traveled along the length of the doctor blade, similar to squeezing toothpaste from a tube, in order to supply the applied composition in preparation for the next coating step.

Referring now to FIG. 1, in operation computer assembly 130 would initialize the various components, first by checking with the scan assembly 120, through scanner communication line 132, to ensure operability and to cause the scanned beam 102" to point preferably to a position away from the coating station 140. Next computer assembly 130 would initialize the coating station 140, referring now to FIG. 2, by moving the platform 244 (by means of platform translation motor 146 controlled through communication line 136 in FIG. 1) such that its upper surface is even with the surface of the vat 249. Then computer assembly 130 would translate the doctor blade 241 (by means of blade translation means 148 through communication line 138 in FIG. 1) such that any photoformable composition 242 remaining from previous equipment use is collected and stored by screw conveyor 256 and pump 252 (controlled through handling communication line 135 shown in FIG. 1) in chamber 254. Finally, referring again to FIG. 1, the computer assembly 130 may ensure readiness of the radiation source 100 by signaling through laser communication line 131.

In preparation for making an object, through an interface with the computer assembly 130, an operator chooses a CAD design, preferably in an .STL format, orients it and scales it to the desired size as verified through a video monitor and then sets the computer assembly 130 free to fabricate the object. The computer assembly 130 then slices the object data file into cross-sections, each cross-section representing an X-Y set of data representing a thickness of each individual cross-section of the object to be fabricated. Next the platform 244 in FIG. 2A is moved down a distance substantially equal to the thickness of the first cross-section, however, on the first layer the platform 244 may be moved a distance more or less depending on the coating characteristics of the composition 242 or the doctor blade 241 as disclosed earlier. Simultaneously, referring to FIG. 2B, pump 252 draws a quantity of supply composition 242''', through tube 253, from chamber 254, pumping the supply composition 242''' through tube and linear extrusion opening 258, thereby forming an mound of applied composition 242' in advance of the doctor blade 241. Enough applied composition 242' is supplied to uniformly fill the vat 249 region left voided by movement of the platform 244 one layer thickness down. Typically, some excess applied composition 242' is supplied to reduce the potential for air bubbles forming during the coating application. Next the doctor blade 241 is translated, at a speed necessary to adequately shear-thin the applied composition 242', to the opposite side of the vat 249, thereby smoothing a thin composition layer 242" over the surface of the platform 244. Once the coating 242" has been applied, referring now to FIG. 1, computer assembly 130 directs scan assembly 120 X motor 126 and Y motor 128 to scan out the X-Y cross-section of the object to be formed. Simultaneously, the beam 102 is modulated, by modulator 104 controlled through modulator communication line 134, by the computer assembly 130 in order to ensure proper exposure control within the image to be photoformed by scanning beam 102". Also simultaneously, referring again to FIG. 2B, doctor blade 241, which abuts screw conveyor shroud 256, is cleaned by screw conveyor 257, and the excess applied composition 242' is transferred to the chamber 254 where it is stored and where air is removed through tube 255. And, pump 252, drawing supply composition 242''' from chamber 254 through tube 253 again deposits an amount of applied composition 242' in a line in advance of doctor blade 241 in preparation for coating the next layer. Heat Q is supplied to heat the doctor blade 241, shroud 256, screw conveyor 257, chamber 254, transfer tubing 253, pump 252, supply and linear extrusion opening 258, supply composition 242''', and portions of vat 249 when heat liquefiable viscosity reducible compositions 242 are utilized. Referring again to FIG. 2A, once the first photoformed layer 243 has been completed, platform 244 moves down a distance substantially equal to the thickness of the second representative cross-sectional layer. The coating, scanning, blade cleaning, applied coating supply, and platform movement steps continue in sequence or simultaneously as described above until a three-dimensional is imaged. Next, the platform 244 is raised, if the viscosity reducible composition 242 flows by its own weight, the composition handling assembly 250 collects the unexposed photoformable composition and stores it in chamber 254. Otherwise, the composition 242 and the object 243 are removed in bulk from the raised platform where they are separated from each other by oven heating, heat gun liquefying, brushing, pressurized air, blotting by absorbent materials, and the like means as necessary for the composition 242 in use. The composition 242 is then returned to chamber 254 for use in future Solid Imaging applications. The formed object 243 is further cleaned with heat, solvent, brushes, and the like, and post cured as necessary to obtain the desired final physical properties.

Other coating apparatus 140 may be substituted for that shown in FIG. 1 and detailed in FIGS. 2A and 2B. For example, FIG. 3 shows a coating method wherein a linear extrusion head 358, which translates across the surface of the vat by head translation means 348 (shown as an arrow for simplicity), extrudes an applied composition 342', of viscosity reducible composition 342, creating a new composition layer 342". The composition to be applied is stored in chamber 354 and is delivered through tubing 353. In this case for example, air fed into chamber 354 under pressure causes the composition to flow out of the extrusion head 358. In practice, a precise amount of applied composition 342' may be uniformly extruded, however, preferably, excess applied composition 342' is extruded from extrusion head 358 and this excess applied composition 342' moves before the head 358. The extrusion head 358 also acts as a doctor blade or an additional doctor blade (not shown) may be attached to the head 358 to smooth out the excess applied composition 342'. This extrusion head 358 may be adaptable to rotate about an axis 359 such that the extruded applied composition 342' leaves the extrusion head 358 opening in advance of the head 358 translation and the trailing edge of the extrusion head opening acts as a doctor blade. At each end of the vat 349 the extrusion head 358' stops (In FIG. 3 only one extrusion head 358 exists, however, FIG. 3 shows the head 358 in two positions, one while coating and one while stopped.) where flow from tube 353' is stopped since the head 358' is blocked by the vat 349 surface. The excess applied composition 342' then drains off as drained composition 342''' where it is collected in trough 356 and can be reused. If desired, heat (shown as a Q with an arrow) can be supplied to the composition handling apparatus 350 or methods of collecting excess applied composition 342', such as those shown in FIGS. 2B, may be employed. The platform 344, acting as a piston, translates down into vat 349 by means of a screw 345 driven by platform translation means 346 after each layer is imaged and prior to coating a new composition layer 342" on object layers 343 and composition 342. For some compositions 342 it may be necessary to Teflon® coat, heat, or lubricate the vat 349 interior walls to expedite sliding of the platform 344 and composition 342. If necessary for the viscosity reducible composition 342 in use, the trough 356 may contain a screw conveyor, or scraper, or may be heated to collect the drained composition 353'''. The operative steps of the coating apparatus shown in FIG. 3 are similar to that explained for FIGS. 2A and 2B.

FIG. 4 depicts an preferred alternate coating apparatus for use with viscosity reducible compositions that have a very high yield value under low shear or for compositions that are heat liquefiable and solidify when not heated or when cooled. In this case the composition handling apparatus 450 has elements similar to that shown in FIG. 3. However, in the case of these compositions 442, the vat is not necessary since the composition acts as a semi-solid or solid. A ring 449 may be placed at the end of travel of each extrusion head 458' travel to act as a type of valve to block the flow of material supplied to the extrusion head 458 by tube 453. In addition, the ring 449 may act as a form for the edges of the applied composition 442" during the coating of the composition 442" until its viscosity increases. Heat flow Q (which may be in the form of cooling or heating) may be supplied to the ring to either viscosity reduce or viscosity increase the composition 442" edges as necessary to allow release of the composition 442 from the ring 449, during platform 444 movement. Naturally any suitable valve could be utilized in feed line 453' to block the flow when the head is not translating. As in other cases heat (shown as a Q with an arrow) may also be supplied to the composition handling apparatus 450 to maintain the composition in a viscosity reduced state within the chamber 454, feed tube 453, and extrusion head 458. Other methods of maintaining the composition in a viscosity reduced state may be, for example, vibration of the composition or agitation of the composition. In the example shown in FIG. 4, air pressure is applied to chamber 454 to drive the composition through extrusion head 458 for coating. However, such a driving mechanism could be a pump in line 453 or even gravity flow. During operation extrusion head 453 is translated by head translation means 448 (shown as an arrow for simplicity) across the surface of the platform 444 or the surface of a previously photoformed layer 443 and previously applied solidified composition 442 in such a manner as to create a new coating layer 442". Applied composition 442', which is viscosity reduced by applied shear or by heat, travels ahead of extrusion head 458, which also may act as a doctor blade. Once the new composition layer 442" is applied, it substantially increases in viscosity such that it is a near solid or solid. This increase in viscosity is due to a reduction in applied shear or due to cooling. The extrusion head 458 translates to ring 449 where flow is stopped from the extrusion head 458'. If desired, ring 449 may also include a screw conveyor or scraper to remove the excess applied composition 442' from the surface of the extrusion head 458'. Excess applied composition 442' may also be collected and reused by use of a drip pan under platform 444. Platform 444 is translated relative to the composition handling apparatus 450 and to the imaging apparatus (as shown in FIG. 1) by means of platform translation device 446 through means of screw 445. After each layer 442" is coated, the object layer is exposed imagewise creating a new object layer 443. Once all object layers 443 have been fabricated, the composition 442 and object 443 are removed from the platform 444. Removal of the solid or semi-solid composition 442 from the object 443 depends on the nature of the viscosity reducible composition 442 in use. The composition 442 can be removed by oven heating and liquefying of the composition 442, where the object 443 which does not liquefy remains, or by brushing, by ultrasound, or by use of a suitable solvent, or any combination of the above.

Figure 5:
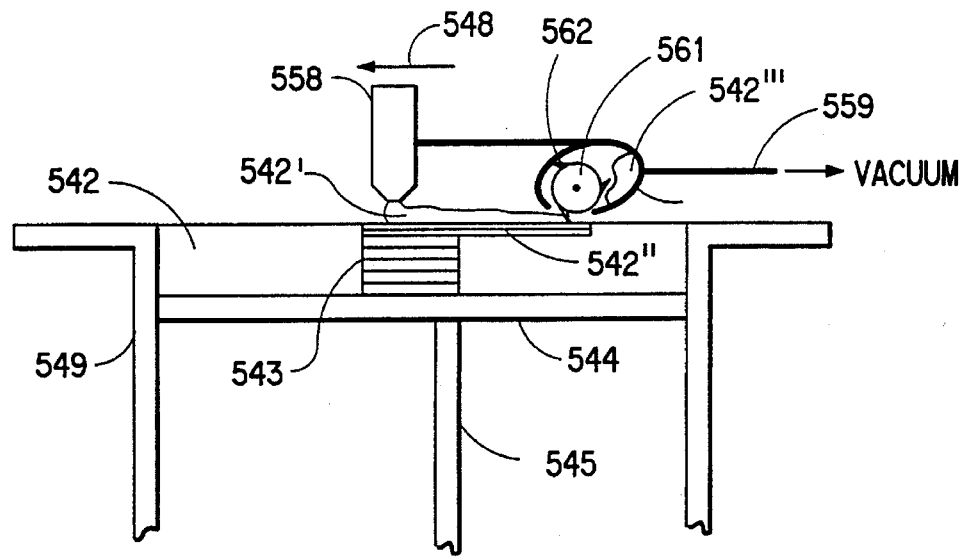
FIG. 5 exhibits a coating station in which excess applied viscosity reducible composition is removed utilizing a high shear rate apparatus in order to create a uniform coating during the Solid Imaging process.

While apparatus such as shown in FIGS. 1 through 4 depict coating methods where a relatively high shear rate is utilized to cause the viscosities of the compositions to reduce during application, there are other coating methods in which extremely high shear rates are applied in order to remove portions of the excess applied composition in order to form composition layers of uniform desired thickness. For example, FIG. 5 shows a coating apparatus wherein an excess of applied coating 542' is placed on the previous composition 542 and the previous object layers 543 using an elongated extrusion head 558 which translates over the surface of the vat. Shown attached to the extrusion head 558 and translating with the head 558 is a rotating knife assembly consisting of a composition collection shroud 556, a rotating blade shaft 561 and blades 562. Not shown is a motor that causes the shaft 561 to rotate at high speeds and also causes the blades 562 to apply a high shear rate to the excess composition 542'. This causes the upper portion of excess applied composition 542'" to reduce in viscosity and also causes the removal of this upper portion without substantially reducing the viscosity of the remaining composition layer 542" or affecting the object layers 543 or the composition 542 in the remainder of the vat 549 (shown in partial view). The excess composition 542'" cut off by the rotating blades 562 is caught by the shroud 556 and drawn, for example, by vacuum to a storage tank (not shown) for reuse. The coating assembly is translated by head translation means 548. For solid or semi-solid viscosity reducible compositions 542 the blades 562 may remove the excess portions of applied composition 542'" much as a joiner removes the surface of wood. As may be envisioned, since the excess composition is collected by the shroud and the vacuum device, such a coating system is not constrained to operate at the surface of a vat and may be useful even when the vat walls are higher than the image plane.

Other types of apparatus and variations on the above described apparatus that are capable of applying a high shear rate to a portion of the composition may be envisioned. For example, a vibrating blade such as a microtome, or a quick translating piano wire cutter (like a cheese cutter), or even a heated wire cutter, or an air knife, etc. may prove useful high shear rate inducing devices that cause the excess applied composition at the surface of the vat or the surface of a solid or semi-solid composition to viscosity reduce in a very localized slip zone, thereby allowing removal of the excess composition without substantially affecting the remainder of the composition or the previous object layers.

In addition, other types of platform/cylinder apparatus may prove useful in Solid Imaging applications with viscosity reducible photoformable compositions. For example, referring to FIG. 6, the platform 670 could be essentially a flat surface on top of which thin rings 680, for example first ring 680', second ring 680" and third ring 680'", are laid prior to coating of a photoformable composition layer 642". Any one of the coating methods shown in the previous figures could be utilized to create this composition layer 642" and the principles involved in coating would be similar. In practice, initially there would be provided a surface 670 preferably substantially flat on which a first ring 680' also preferably substantially flat would be placed and affixed by, for example, adhesive, magnetism, friction, or mechanical means (not shown). The rings 680, shown as round, may actually be square or of any shape desired so long as they are adapted to contain all portions of a representative cross-section of an object being fabricated and as long as they are adapted to contain the viscosity reduced and viscosity reducible photoformable composition being coated. The thickness of the rings 680 may vary according to the desired thickness of the representative slice being imaged and the rings 680 may be thicker or thinner than the representative imaged layer slice since coating thickness variations often are exhibited while coating depending on the composition and coating method utilized Next, after affixing first ring 680', a uniform composition layer 642" is applied filling in the interior of the first ring 680' with a thickness substantially co-planar with the top of first ring 680'. Then the composition layer 642" is imaged by means as described above and in FIG. 1. After imaging, a second ring 680" is placed on top of the first ring 680' and affixed as described above. This second ring 680" is filled with a uniform layer 642" of composition as before and the next representative slice layer is imaged. This process continues by adding the rings 680, coating the composition layer 642" and imaging until all layers of a representative object have been coated and imaged. Finally the rings 680 and object (not shown) are removed from the platform 670 and the object is post-processed by methods as described elsewhere in this disclosure.

Figure 6:
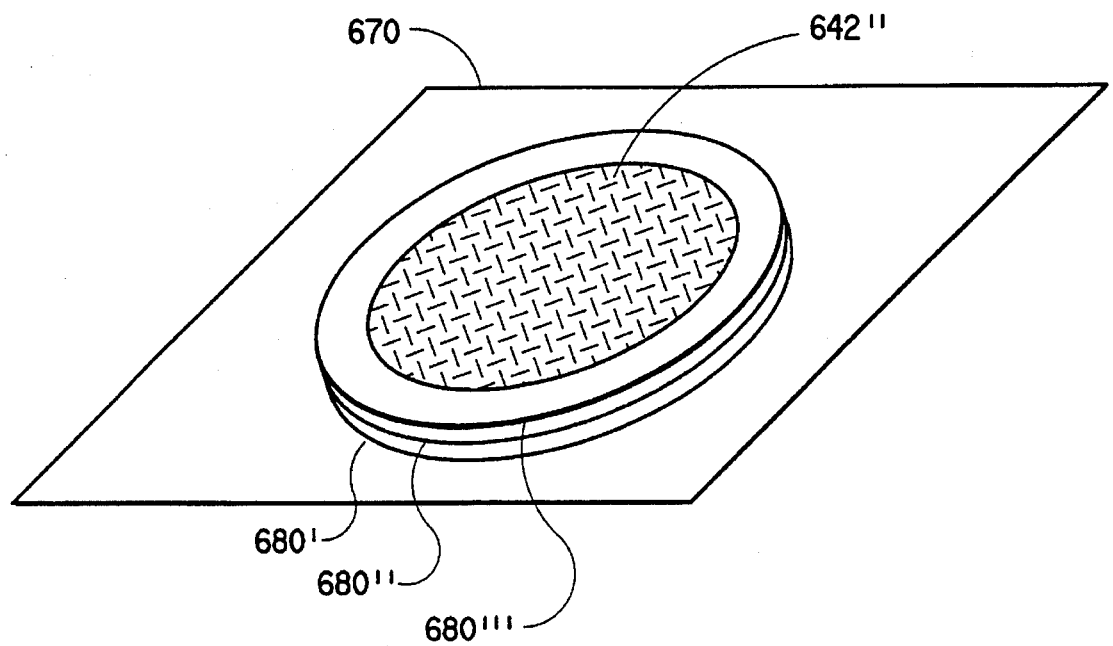
FIG. 6 depicts an alternative apparatus for building up layers of a viscosity reducible composition during the Solid Imaging process.

For such a Solid Imaging apparatus, as shown in FIG. 6, it is preferable that the composition be of relatively high viscosity since the rings 680 may not necessarily exactly conform to the surfaces of each other or the platform 670 and therefore may have a tendency to leak as the object is being fabricated, thereby introducing the potential for distortion of the object. Higher viscosity liquids would not drain so quickly and therefore would be more forgiving of inaccuracies in the surface of the rings. Viscosity reducible compositions would be even more preferable for the same reasons and for reasons described elsewhere in this disclosure. Heat liquefiable compositions are even more preferred for use with this apparatus since the solidification or semi-solidification of the composition would aid in affixing the rings 680 to each other and to the platform 670.

Examples of various viscosity reducible compositions useful in Solid Imaging are:

Example 1—Solid room temperature Exposure 8.65 grams of Sartomer® C9503 (Arco Chemical Co., Newtown Square, Pa.), which is a difunctional aliphatic urethane acrylate ester and which is wax-like at room temperature, was mixed with 0.12 grams of Irgacure® 651, (CIBA-Geigy Ltd., Switzerland), which is 2,2-dimethoxy-2 phenylacetophenone, by first heating the Sartomer® above 80° C. to liquify and then adding the Irgacure®.

A portion of this heated composition was poured into a petri dish. The composition self-flattened and then solidified, by cooling, to a tacky solid. In this case, the composition was then exposed imagewise through the bottom of the petri dish. Next, the petri dish and contents were heated until the unexposed portions of the composition could be poured off. The cooled remaining object was then removed and cleaned with trichloroethane, which had little effect, then acetone. A flat disk object was obtained.

Notably, the exposed portions of the cooled composition, within the petri dish prior to heating, were indistinguishable from the unexposed portions. Normally, when exposing photopolymers, there are visual indications, such as refractive index changes, surface tension effects, clouding, and/or signs of shrinkage, that allow one to distinguish the exposed from the unexposed portions of a composition layer. In addition, upon exposure, there is an exothermic heat generated by the polymerization in the exposed regions. However, when exposures were made with solid or near solid photoformable compositions, there were no such distinguishing features visible and there was no appreciable heat rise due to exotherm. However, upon heating the petri dish, in Example 1, the imaged region suddenly became visibly distinguishable.

It is suggested that the following may be an explanation for this unusual occurrence. This is meant as an explanation only and by no means should it be considered to be limiting to the scope and breadth of the invention described herein:

This indicates that the exposure generates radicals which remain substantially active but do not produce polymerization until the composition is heated. Theories that exist to explain this phenomenon, describe it in terms of diffusion of the radicals. In the solid state, the radicals are constrained from diffusing and interacting with the other components of the composition. Once the solid is liquefied or raised above its glass transition temperature, however, the radicals quickly diffuse and polymerization ensues.

Such a phenomenon is a surprisingly fortuitous feature of a heat liquefiable photoformable composition. Consider that a liquefied layer is coated and allowed to cool to a solid, then exposed imagewise. Within this layer in the image regions, radicals are generated, however no substantial photoformation occurs. In essence there is a potential imagewise photoformation stored within the layer. A second layer of heat liquefiable photoformable composition is applied, allowed to cool, and imaged with similar results. Once all the layers are applied and imaged, there is essentially a three-dimensional region of potential photoformation produced, however, there has not yet been the formation of the object. Upon heating this region, the potential photoformation becomes an actual photoformation. The advantages of this method are that, the layers of potential photoformation are now in intimate contact, and not only do the radicals diffuse within the layer but they also diffuse into the interface between the layers. Therefore, the interlayer adhesion is substantially improved. In addition, since during the imaging steps, the radicals were substantially not mobile and the inhibitors, such as oxygen, were also substantially decreased in mobility throughout the solidified potential photoformation region, there is the possibility for more radicals to be available to create photoformation when the object mass is heated. This not only improves interlayer adhesion, but also ensures more complete conversion within the formed object.

However, there are also important considerations associated with such a solid exposure process. One important consideration is that the exothermic heat produced, as the potential photoformation becomes active photoformation, can quickly build up a temperature high enough to crack and deteriorate the object. In general, the diffusion of radicals generated from, for example an exposure to radiation, will reduce at temperatures below the glass transition temperature. On the other hand, the glass transition temperature of a medium typically increases as photoformation increases. Therefore, for example, if a photoformable medium is exposed at a temperature below the glass transition temperature, the diffusion of radicals and therefore rate of photoformation will initially be relatively low. But if this medium's temperature is raised to just above the glass transition temperature, the diffusion rate increases and photoformation increases. However, with increased photoformation of the medium, the glass transition temperature also increases. If the rate of glass transition temperature increase is greater than the medium's temperature rate increase from the exothermic heat of the photoformation, the diffusion of radicals will decrease and therefore the photoformation reaction will become self-limiting. Should the rate of glass transition temperature increase be less than the medium's temperature rate increase due to exothermic heat, the photoformation reaction will become self-accelerating.

It is this self-accelerating photoformation reaction that is most likely to produce cracking or degradation of the object region undergoing photoformation. Several means may be employed to limit the self-acceleration. For example, photoformable compositions with a low ratio of carbon-carbon double bonds per molecular weight might be self-accelerating under photoformation, but since the amount of photoformation is relatively low, the temperature rise would not be sufficient to induce cracking or degradation. Such a scheme is especially useful and preferred with a photoformable composition which is naturally a solid at, for example, room temperature and may have adequate physical properties while only slightly photoformed. Or, for example, such a composition as described above, may contain components that are relatively inert to the photoformation process (including the temperatures reached during the photoformation exothermic heat) but are cured by other means, for example much higher temperatures or radiations of a different kind, and therefore impart additional useful physical properties to the object upon polymerization of the second component. Or, for example, the composition may contain, for example, a plasticizer, which allows a modicum of photoformation to occur starting from the time of exposure, but at such a slow rate that the exothermic heat is dissipated faster than it is produced. Once the object layers of plasticized composition have all been build up and exposed, and after a suitable wait period, a final cure could be initiated, which still may cause self-accelerated photoformation but would be limited since some of the photoformation has already taken place. Such a plasticized photoformable composition may still be solid during the Solid Imaging process in which, for example, a heat liquefiable coating method is used to form the object layers. Or, for example, the composition may contain components that have high heat capacity, which components serve to restrict the temperature rise and therefore the self-acceleration of the photoformation reaction. Or, for example, the potential photoformation object region could be subjected to controlled cycles of heating and cooling such that the self-acceleration is quenched by cooling. Or for example, the potential photoformation object region could be placed in a medium, for example water, by which heat could be supplied, but if auto-acceleration created too high a temperature, the medium would either absorb the heat by heat capacity or by a phase transformation. Or, for example, the potential photoformation object could be heated from one side only to start the photoformation reaction and the self-accelerating photoformation would continue through the object region as a wave, but since the photoformation does not occur all at once, the temperature rise would not be as drastic.

Another important consideration is that there may actually be fewer radicals present within the potential photoformation region due to recombination of radicals that were constrained from diffusing. This is at least what an Applicant suggests may have occurred in the following experiment:

Example 2—Solid, Lower Than Room Temperature Exposure

Celrad® 12 (Celanese Corporation, Louisville, Ky.), which is bisphenol A epoxylated-diacrylate, was mixed with 2% by final solution weight Irgacure® 651 and approximately 4% by final solution weight of TMPTA (Radcure Specialities, Inc.), which is trimethylolpropane triacrylate. The composition was a high viscosity liquid at room temperature. The composition was placed into two petri dishes and allowed to self-flatten. One petri dish was cooled to 8° C. causing the composition to solidify. Both samples, the room temperature (24° C.) sample and the cooled sample, were exposed to a circular beam of filtered light from a mercury arc lamp for one minute. The thickness of the room temperature sample hardened disk, when removed from the surrounding unexposed composition was 0.5 mm. The thickness of the cooled sample disk, isolated from the surrounding unexposed composition after the sample was warmed to room temperature, was 0.2 mm.

Example 3—Solid Lower Than Room Temperature Exposure

A mixture of Celrad® 12 was mixed with 2% by weight Irgacure® I-651 and then cooled to approximately 3° C. to form a solid This solid mixture was heated to 35° C. poured, and doctor blade coated into a cavity formed by a cooled (at about 3° C.) metal support platform and a cooled metal ring of diameter 6 cm and 5 mm high connected to a metal bar. The surface of the coated composition was exposed from the top with the substantially collimated light of a filtered (330–360 nm) 200 W high pressure mercury arc lamp for one minute through a circular aperture. Then the bar and the ring was heated with a gas flame, causing the ring to liquefy the hardened composition at their interface. Once liquefied, the platform and the hardened composition were lowered the distance of one layer (about 2 mm in this case but thicknesses of less than 1 mm can be easily achieved) such that a new cavity was formed above the hardened composition layer and the ring inner edge. The new cavity was filled again with heated composition and smoothed off. The composition was allowed to cool and the cooling was speeded up by blowing a stream of liquid nitrogen on the surface of the composition. The process was repeated another time. Then the support with the composition was placed in an oven at 50° C. The unexposed photoformable composition liquefied and the exposed part was isolated.

Example 4—Semi-Solid/Plastic Flow

A semi-solid, i.e., a material with viscosity reducible characteristics similar to that of margarine or butter, was produced by mixing 11.3 grams of molten paraffin wax in 10 grams of Plex 6696 (Rhom Tech, Inc., New York, N.Y.), which is an unsaturated acrylic ester, 0.1 grams of Irgacure 651, and a surfactant FC-430 (3M Corporation, St. Paul, Minn.), which is a mixture of fluoroaliphatic polymeric esters and toluene, at 60° C. This essentially creates a dispersion that should be mixed aggressively and then mixed more gently while cooling to room temperature to prevent agglomeration. This composition was smeared on a surface and then exposed, producing a white solid in the exposed regions Upon reheating to around 60° C. the unexposed regions liquefied and were absorbed by a paper towel. The remaining solid could be further cleaned with petroleum ether.

Example 5—Shear-Thinning With A Yield (Plastic Flow)

A shear-thinning with a yield or Bingham body flow composition having a paste-like consistency was produced from the following formulation:

| Component | Content (grams) |
| --- | --- |
| Novacure ® 3704 (Celanese Speciality Resins, Louisville, Kentucky) acrylated esters of epoxy resins | 48 |
| TMPEOTA (Arco Chemical Co., Newtown Square, Pennsylvania) trimethylolpropane polyoxyethylene triacrylate | 48 |
| Plasthall ® 4141 (triethylene glycol dicaprate, triethylene glycol dicaprylate CP Hall Company) | 24 |
| Triton ® X-100 (Rhom & Haas Company, Philadelphia, Pennsylvania) octylphenoxypolyethoxyethanol nonionic surfactant | 1.6 |
| Irgacure ® 651 | 2.88 |
| Microfine ® MF-6X (Trans Penn Wax Corporation of Titusville, PA) 1 μm average size, micronized wax powder | 60 |

The above elements were combined and osterized for two minutes. This material was tested on a Haake CV-100 rotational viscometer to determine the viscosity and yield stress with the following results:

| Viscosity (poise) | | | Yield Stress |
| --- | --- | --- | --- |
| 0.3/s | 100/s | 3000/s | (dynes/cm$^2$) |
| 4600 | 35 | 9 | 1300 |

An ashtray approximately three inches square by 0.33 inches high was fabricated using this mixture. The base of the ashtray was approximately two inches square and the various layers of approximately 10 mil thickness had cantilevered overhangs that increased gradually from the bottom first fabricated layers to the top last fabricated layers. The exposure and coating was accomplished using equipment as shown in FIGS. 1 and 2A, except that the excess applied composition was supplied manually in front of the doctor blade, at the edges of the vat, and there was no mechanical recovery of the composition. The material was coated with a high shear rate. The part was exposed using an Argon Ion laser operating in the UV (350–363 nm) and the scanning was vector scanning. In comparison with similar ashtrays formed with compositions of low viscosity, the ashtray made with the viscosity reducible composition, in this example, had improved surface flatness and more uniform layer thicknesses when coated utilizing a doctor blade operating at a speed to induce shear-thinning behavior in the composition during coating. Also, the unexposed viscosity reducible composition was removed using mechanical means, for example forced air and towel wipes and mild solvent rinse, to clean the part. In addition, this composition has exhibited excellent stability left at rest for over a year.

Other shear-thinning with a yield flow compositions have been made typically by adding particles or beads to a monomer or oligimer and photosensitizer composition. Some examples of such particles or beads are; TW-6 Cromalin® toners (E. I. du Pont de Nemours and Company, Wilmington, Del.) which are cellulose acetate beads of approximately 2 μm diameter; or, zinc-diacrylate beads; or, poly-TMPTA beads (pre-polymerized TMPTA particles); or, microcapsules, hollow microspheres, etc., for example, Expancel® hollow microspheres (Expancel, Nobel Industries Sweden, Sundsvall, Sweden), which consist of isobutane gas surrounded by a copolymer of vinylidene chloride and acrylonitrile shell; or, other powders such as for example Fluo™ 300 (at approximately 33% by weight mixture, for example) 3 μm average size PTFE powders (Micro Powders Inc., Yonkers, N.Y.).

Example 6—Thixotropic Compositions

Many of the compositions given as examples in this disclosure may exhibit some degree of thixotropy. However, other compositions containing, for example, modified cellulose, colloidal silicas, or high molecular weight polyethylene oxides, and the like have a tendency to form a structure within the composition over a period of time.

An example of a thixotropic photosensitive composition is a mixture of V-Pyrol® (49 g) (GAF Chemical Corporation, Wayne, N.J.) and urethanediacrylate (see Example 1) (49 g) with 2% Irgacure combined and stirred at room temperature with Aerosil (SiO₂, 5 g), which is amorphous silicon dioxide. This material shear-thins during coating and quickly forms a gel-like condition. After exposure, an object layer was isolated and wiped off. The part could also be developed (separated from the surrounding unexposed solution) using an organic solvent.

Example 7— Pseudoplastic Compositions

As with thixotropy, most of the solutions exhibited pseudoplastic flow behavior. However, in some cases, the thixotropic or yield stress characteristics were not predominant or measurable in the compositions. For example, there are organic additives which have been included in photosensitive investment casting pattern compositions in relatively small amounts. These additives improve the stability of the microsphere containing compositions by imparting thixotropic flow behavior characteristics. Three examples of such materials are Thixcin® R, Thixatrol® ST, and Thixatrol SR (RHEOX, Inc., Hightstown, N.J.). Thixin® R (trihydroxy stearin) and Thixatrol® ST are powdered organic derivatives of castor oil and Thixatrol® SR is a proprietary mixture of 30% solids in cyclohexanol/petroleum stock. These materials are sold as thixotropic agents, however, viscosity tests performed with these agents added to a microsphere containing pattern composition exhibited either pseudoplastic or plastic flow behavior without the characteristic thixotropic loop. Generally these agents are added to compositions at 0.2 to 0.8% by weight, though for higher thixotropy index compositions, as much as 2.0% by weight agent may be added.

The following stock solution was formulated:

| Component | % by Wt. |
| --- | --- |
| Photomer® 4127 (propoxylated neopentylglycol diacrylate, Henkel Corporation, La Grange, IL) | 8.7 |
| V-Pyrol® /RC (N-vinyl-2-pyrrolidone GAF Chem. Corp., Wayne, NJ) | 26.2 |
| Plasthall® 4141 | 18.6 |
| Elvacite® 2041 (polymethyl methacrylate Du Pont, Wilmington, DE) | 1.1 |
| Ebecryl® 3704 (Bisphenol A bis(2-hydroxypropyl) diacrylate, Radcure Specialties Inc., Louisville, KY) | 43.7 |
| Irgacure® 651 (2,2-dimethoxy-2-phenylacetophenone CIBA-Geigy Ltd., Switzerland) | 1.7 |

The first four components of the above stock solution were combined and stirred at 120° F. till well mixed and dissolved, then the remaining components were added and mixed. 150 gram portions of this stock solution were used in tests for Examples 7A–7C, in which the following quantities of the various "thixotropic" agents and microspheres were added.

Example 7A 2 grams of Thixcin® R were added to the stock solution, then mixed in a Waring blender at fast speed for 20 minutes at 120°–130° F. The viscosity (after the compositions were allowed to rest for enough time to remove thixotropic effects) was measured using a Brookfield Digital Viscometer, Model DV-II with a #3 spindle from a LV spindle set. The speed of 3 RPM and 30 RPM calculate to a shear rate of 0.63/sec and 6.3/sec respectively at the face of the spindle:

@ 3 RPM the viscosity was 5,440 centipoise.

@ 30 RPM the viscosity was 1,420 centipoise giving a thixotropic index of 3.8.

Next, 2.25 grams of Expancel® 461 DE were added while stirring with an average speed motor and the following viscosity values were measured:

@ 3 RPM the viscosity was 12,400 centipoise.

@ 30 RPM the viscosity was 3,410 centipoise giving a thixotropic index of 3.6.

Example 7B 2 grams of Thixatrol ST were added to another portion of the stock solution and blended fast at 135° F. for 20 minutes.

Next, 2.25 grams of Expancel 461 DE were added and stirred with an average speed of rotor. Using the same equipment as in 7A above the following viscosity values were measured:

@ 3 RPM the viscosity was 7,210 centipoise.

@ 30 RPM the viscosity was 2,450 centipoise giving a thixotropic index of 2.9.

Example 7C 2.25 grams of Expancel® 461 DE were stirred into another portion of the stock solution using an average speed of rotor. Using the same equipment as in 7A above the following viscosity values were measured:

@ 3 RPM the viscosity was 1,000 centipoise.

@ 30 RPM the viscosity was 715 centipoise giving a thixotropic index of 1.4.

The addition of the microspheres imparts a pseudoplastic or plastic flow characteristic to the photoformable composition.

Next 4 grams of Thixatrol® SR were added to the mixture and stirred with a rapid motor speed for 30 minutes at 120° F. The viscosity values measured were:

@ 3 RPM the viscosity was 3,910 centipoise.

@ 30 RPM the viscosity was 1,970 centipoise giving a thixotropic index of 2.0.

Each of the above solutions in Examples 7A–7C were placed in separate brown bottles and examined periodically for separation. The solutions were rated OK if they appeared to have uniform opacity and NP (not preferred) if they exhibited a clear layer at the bottom of the solution. In the case where no "thixotropic" agent was added, the composition tested was that of Example 7C prior to the addition of Thixatrol® SR.

| Solution Age | No Agent | Example 7A | Example 7B | Example 7C |
|---|---|---|---|---|
| 2 hours | NP | OK | OK | OK |
| 1 day | NP | OK | OK | OK |
| 2 days | NP | OK | OK | NP |
| 4 days | NP | OK | OK | NP |
| 6 days | NP | OK | OK | NP |

The results of this testing suggest, that in solutions containing microspheres, that a thixotropic index of at least 2.0 is preferred and a thixotropic index of greater than 2.0 is more preferred in order to retain stability of the mixture over a long period of time. Naturally this conclusion will vary significantly based on the composition viscosity, in that generally higher viscosity solutions (in low shear-rate conditions) will have less tendency to separate. But even with such higher viscosity compositions, a thixotropic index of greater than 2.0 is more preferred since coating of solutions is preferably accomplished under the relatively high shear rate conditions that would be imparted by, for example, a doctor blade or a linear extrusion head. It should be clarified that when the term thixotropic index is utilized, the actual meaning of the index is a measurement of the tendency of the composition to shear-thin as a function of shear rate. In the cases sited, the thixotropic index is the ratio of the viscosity at the relatively high shear rate induced by a Wells-Brookfield Microviscometer operating at 30 RPM compared to the viscosity measured at 3 RPM. In this sense, no judgement can be made as to whether the compositions are specifically thixotropic, pseudoplastic, plastic flow (Bingham body), or some combination of these flow behaviors. However, the compositions measured were shear-thinning as opposed to Newtonian, dilatant, or rheopectic flow behavioral compositions.

A photohardenable composition for solid imaging should contain at least one photohardenable monomer or oligomer and at least one photoinitiator. For the purposes of this invention, the words monomer and oligomer have substantially the same meaning and they may be used interchangeably.

Examples of suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di(p-hydroxyphenyl)propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are ethoxylated trimethylolpropane triacrylate, ethylated pentaerythritol triacrylate, dipentaerythritol monohydroxypentaacrylate, 1,10-decanediol dimethylacrylate, di-(3-acryloxy-2-hydroxylpropyl)ether of bisphenol A oligomers, di-(3-methacryloxy-2-hydroxyl alkyl)ether of bisphenol A oligomers, urethane diacrylates and methacrylates and oligomers thereof, caprolactone acrylates and methacrylates, propoxylated neopentyl glycol diacrylate and methacrylate, and mixtures thereof.

Examples of photoinitiators which are useful in the present invention alone or in combination are described in U.S. Pat. No. 2,760,863, and include vicinal ketaldonyl alcohols such as benzoin, pivaloin, acyloin ethers, e.g., benzoin methyl and ethyl ethers, benzil dimethyl ketal; Q-hydrocarbon-substituted aromatic acyloins, including α-methylbenzoin α-allylbenzoin, α-phenylbenzoin, 1-hydroxylcyclohexyl phenol ketone, diethoxyphenol acetophenone, 2-methyl-1-[4-(methylthio)phenyl]- 2-morpholinopropanone-1. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, acryloxy benzophenone, 2,4,5-triphenylimidazolyl dimers with hydrogen donors including leuco dyes and mixtures thereof as described in U.S. Pat. Nos. 3,427,161, 3,479,185 and 3,549,367, can be used as initiators. Also useful with photoinitiators are sensitizers disclosed in U.S. Pat. No. 4,162,162. The photoinitiator or photoinitiator system is present in 0.05 to 10% by weight based on the total weight of the photohardenable composition. Other suitable photoinitiation systems which are thermally inactive but which generate free radicals upon exposure to actinic light at or below 185° C. include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tertbutylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethylanthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione; also, alpha amino aromatic ketones, halogenated compounds like trichloromethyl substituted cyclohexadienones and triazines or chlorinated acetophenone derivatives, thioxanthones in presence of tertiary amines, and titanocenes.

Although the preferred mechanism of photohardening is free radical polymerization, other mechanisms of photohardening apply also within the realm of this invention. Such other mechanisms include but are not limited to cationic polymerization, anionic polymerization, condensation polymerization, addition polymerization, and the like.

Other components may also be present in the photohardenable compositions, e.g., pigments, dyes, extenders, thermal inhibitors, interlayer and generally interfacial adhesion promoters, such as organosilane coupling agents, dispersants, surfactants, plasticizers, coating aids such as polyethylene oxides, etc. so long as the photohardenable compositions retain their essential properties. The plasticizers can be liquid or solid as well as polymeric in nature. Examples of plasticizers are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate, triethyleneglycol diacetate, triethylene glycol caprate—caprylate, dioctyl phthalate and polyester plasticizers.

What is claimed is:

1. A method of forming a three-dimensional object comprising the steps of:
    a) coating a layer of viscosity reduced photoformable composition on a surface;
    b) allowing said layer to become a viscosity reducible composition layer having a viscosity greater than said viscosity reduced layer;
    c) exposing said viscosity reducible layer to radiation imagewise by radiation means in order to photoform said layer imagewise;
    d) coating a new layer of viscosity reduced photoformable composition over said previously coated layer;
    e) allowing said new layer to become a viscosity reducible composition layer;
    f) exposing said new viscosity reducible layer to radiation imagewise in order to photoform said new layer imagewise; and,
    g) repeating steps d) through f) until the three-dimensional object is formed.

2. A method of forming a three-dimensional object as recited in claim 1 wherein said viscosity reduced composition is heat liquefied and said composition becomes viscosity reducible by cooling.

3. A method of forming a three-dimensional object as recited in claim 1 wherein said viscosity reducible composition is a solid.

4. A method of forming a three-dimensional object as recited in claim 1 wherein said viscosity reducible composition is a semi-solid.

5. A method of forming a three-dimensional object as recited in claim 1 wherein said viscosity reducible composition is a gel.

6. A method of forming a three-dimensional object as recited in claim 1 wherein said viscosity reducible composition is a high viscosity liquid.

7. A method of forming a three-dimensional object as recited in claim 1 wherein said viscosity reducible composition layer(s) substantially supports said photoformed layer(s).

8. A method of forming a three-dimensional object as recited in claim 1 wherein said viscosity reduced composition is shear-thinned and said composition becomes viscosity reducible by lowering the shear rate applied to said composition.

9. A method of forming a three-dimensional object as recited in claim 8 wherein said viscosity reduced composition is also heat liquefied and said composition becomes viscosity reducible by cooling and by lowering the shear rate applied to said composition.

10. A method of forming a three-dimensional object as recited in claim 8 wherein said viscosity reducible composition exhibits pseudoplastic shear-thinning flow characteristics.

11. A method of forming a three-dimensional object as recited in claim 8 wherein said viscosity reducible composition exhibits plastic shear-thinning flow characteristics.

12. A method of forming a three-dimensional object as recited in claim 8 wherein said viscosity reducible composition exhibits thixotropic shear-thinning flow characteristics.

13. A method of forming a three-dimensional object comprising the steps of:
    a) applying an excess coating of viscosity reduced photoformable composition on a surface;
    b) removing portions of said excess applied coating in order to create a layer of said viscosity reduced composition;
    c) allowing said layer to become a viscosity reducible composition layer having a viscosity greater than said viscosity reduced layer;
    d) exposing said viscosity reducible layer to radiation imagewise in order to photoform said layer imagewise;
    e) applying a new excess coating of viscosity reduced photoformable composition over said previously coated layer;
    f) removing portions of said new excess applied coating in order to create a new layer;
    g) allowing said new layer to become a viscosity reducible composition layer;
    h) exposing said new viscosity reducible layer to radiation imagewise in order to photoform said new layer imagewise; and, i) repeating steps e) through h) until the three-dimensional object is formed.

14. A method of forming a three-dimensional object as recited in claim 13 further comprising the step of recovering said removed excess applied composition.

15. A method of forming a three-dimensional object as recited in claim 13 wherein portions of said excess applied coating and said new excess applied coating are removed by high speed rotating blades.

16. A method of forming a three-dimensional object as recited in claim 13 wherein said viscosity reducible composition layer(s) substantially supports said photoformed layer(s).

17. A method of forming a three-dimensional object as recited in claim 13 wherein said excess applied coating and said new excess applied coating is supplied in advance of the motion of a doctor blade.

18. A method of forming a three-dimensional object as recited in claim 17 wherein said doctor blade is heated.

* * * * *